(12) United States Patent
Park et al.

(10) Patent No.: US 9,158,328 B2
(45) Date of Patent: Oct. 13, 2015

(54) MEMORY ARRAY CLOCK GATING SCHEME

(75) Inventors: Heechoul Park, San Jose, CA (US);
Song Kim, San Jose, CA (US);
Jungyong Lee, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 247 days.

(21) Appl. No.: 13/331,679

(22) Filed: Dec. 20, 2011

(65) Prior Publication Data

US 2013/0159757 A1 Jun. 20, 2013

(51) Int. Cl.
| G06F 1/12 | (2006.01) |
| G06F 1/04 | (2006.01) |
| G06F 1/32 | (2006.01) |
| G11C 7/10 | (2006.01) |
| G11C 8/06 | (2006.01) |
| G11C 8/12 | (2006.01) |
| G11C 15/00 | (2006.01) |

(52) U.S. Cl.
CPC ............... *G06F 1/04* (2013.01); *G06F 1/3275* (2013.01); *G11C 7/106* (2013.01); *G11C 7/1087* (2013.01); *G11C 7/1093* (2013.01); *G11C 8/06* (2013.01); *G11C 8/12* (2013.01); *G11C 15/00* (2013.01); *Y02B 60/1225* (2013.01); *Y02B 60/1228* (2013.01)

(58) Field of Classification Search
USPC ......................................................... 711/167
See application file for complete search history.

(56) References Cited

U.S. PATENT DOCUMENTS

| 7,791,976 | B2 | 9/2010 | Rao et al. |
| 7,861,192 | B2 * | 12/2010 | Chejara ........................ 716/102 |
| 7,925,853 | B2 | 4/2011 | Gschwind et al. |
| 8,000,156 | B2 | 8/2011 | Van Winkelhoff et al. |
| 8,006,108 | B2 | 8/2011 | Brey et al. |
| 8,014,215 | B2 | 9/2011 | Lee et al. |
| 8,015,391 | B2 | 9/2011 | Tani |
| 8,018,247 | B2 | 9/2011 | Priel et al. |
| 8,020,014 | B2 | 9/2011 | Priel et al. |
| 2009/0158076 | A1 * | 6/2009 | Chejara ........................ 713/500 |

(Continued)

OTHER PUBLICATIONS

Sanyal, Sutirtha, et al., "Clock Gate on Abort: Towards Energy-Efficient Hardware Transactional Memory," Barcelona Supercomputing Center, Barcelona, Spain; http://www.bscmsrc.eu/sites/default/files/hppac.pdf; retrieved Sep. 15, 2011, publication date May 2009.

*Primary Examiner* — Jared Rutz
*Assistant Examiner* — Christopher Do
(74) *Attorney, Agent, or Firm* — Marsh Fischmann & Breyfogle LLP; Daniel J. Sherwinter; Kevin J. Duffy

(57) ABSTRACT

Dynamic power consumption is reduced by clock gating registers that synchronize memory input signals in an embedded memory array. Where a memory enable signal associated with a memory interface input signal does not meet setup timing for clock gating input registers of the memory interface signal, a clock gate enable signal may be generated prior to evaluation of the memory enable signal. The clock gate enable signal includes all functions of the memory enable signal and additional conditions because it is generated prior to evaluation of conditions on which the memory enable signal may depend. Pre-evaluated clock gate enable signals may be generated within a processor core and used to clock gate read address registers, write address registers, data input registers, and/or CAM reference address registers of an embedded memory array.

20 Claims, 10 Drawing Sheets

(56) References Cited

U.S. PATENT DOCUMENTS

| | | | |
|---|---|---|---|
| 2010/0070941 A1* | 3/2010 | Sircar et al. | 716/6 |
| 2010/0325452 A1* | 12/2010 | Sundaresan et al. | 713/320 |
| 2011/0271134 A1* | 11/2011 | Hofmann | 713/500 |
| 2012/0139590 A1* | 6/2012 | Myers et al. | 327/113 |
| 2012/0151192 A1* | 6/2012 | Hsieh et al. | 712/226 |

* cited by examiner

MEMORY ARRAY CLOCK GATING SCHEME

BACKGROUND

1. Field of the Description

This Application relates generally to the field of memory arrays and, more particularly, to reducing power consumption in integrated circuits that employ embedded memory arrays.

2. Relevant Background

At the heart of modern computers and consumer electronic devices such as PCs, laptops, servers, smartphones, and tablets is one or more processing elements or central processing units ("CPUs"). These processing elements perform the processing for tasks of the computer or electronics, for example, through an operating system or other software components running on the processor. These processing elements are typically fabricated as one or more integrated circuit ("IC") semiconductor substrates or "chips." A single CPU may include millions or even billions of transistors on the same IC chip.

The processing capabilities of modern CPUs are increasing through advances in semiconductor processing technology that speed up the transistors as well as through use of new processing techniques that increase processing throughput. One such technique is to place multiple units that read and execute processing instructions ("cores") on the same CPU chip. Another such technique is the use of multiple levels of cache memory used to store the most commonly accessed memory locations (e.g., data cache) and/or blocks of processor instructions (e.g., instruction cache) that provide more rapid access to data and/or instructions. One or more of the levels of instruction and/or data cache memory may be embedded within the same CPU chip as the processing core(s). This technique speeds up processing operations because it is typically faster to access an embedded memory than to access a memory implemented as a separate IC chip. Specifically, because embedded memories may be placed physically closer to the processor core(s), the timing paths between the processor core(s) and the embedded memory may be either run at a higher clock frequency and/or require fewer overall clock cycles or latency for particular memory operations. Therefore, embedded memories such as cache can speed up processing operations by reducing the time required for memory operations.

As advances in IC process technology have reduced transistor dimensions, system clock speeds of IC components such as CPUs have also increased dramatically. For example, processor cores of modern CPUs now run at speeds greater than 1.0 GHz and commonly up to 3.0 GHz and beyond. At these higher clock speeds, many data paths within the CPU become critical timing paths. Critical timing paths are generally paths between sequential elements that include routing and/or combinatorial logic that constrain the maximum operating frequency of the CPU. Timing paths that perform large computations such as integer and floating point operations may be critical timing paths because of the amount of combinatorial logic required to perform the computations. Paths with extensive routing within the CPU may also be critical timing paths because of the routing delay caused by resistance and capacitance of the routing wires. Typically, paths within instruction pipelines and arithmetic units of processing core(s) within the CPU may be critical paths. Additionally, paths between blocks of a CPU are also commonly critical paths. For example, paths between a processor core and an embedded memory block on a CPU may be critical paths.

Running ICs at higher clock speeds also increases power consumption, and many IC designs may become power limited, meaning that the maximum operational clock frequency for the IC is determined by the power budget or maximum operating temperature instead of the propagation delays within critical timing paths or other timing constraints of the IC. Clock-gating is one technique that may be used to reduce power consumption. Clock-gating refers to inserting logic elements that turn off (i.e., force to a static state) some clock signals when the states of sequential elements driven by those clocks are not changing. However, inserting clock-gating elements adds delay within the clock path through the clock-gating element. In addition, clock-gating elements also require a minimum time period between the arrival of the clock-gating signal and the clock itself to ensure proper operation. Accordingly, for some critical timing paths, there may not be enough setup time between the clock-gating signal and the clock edge to insert a clock-gating element. Accordingly, reducing power consumption without impacting system clock speed and/or access timing is increasingly important for improving overall performance of systems that include embedded memory arrays.

SUMMARY

Embodiments of the present invention are directed to reducing dynamic power consumption in an integrated circuit by clock gating input registers of an embedded memory array even where associated memory enable signals do not meet setup time requirements relative to a system clock input of the memory array. In various embodiments, clock gate enable signals are generated at processing stages of a processor core or logic circuit that are prior to (or upstream of) the evaluation of the memory enable signals that control the memory operation. In one embodiment, pre-evaluated conditional enable signals are generated within a processor core for use as enable signals of clock gate elements for early stage circuitry like data and address input registers within the memory array.

According to one aspect consistent with various embodiments, a processing device includes a processing component that receives a system clock signal and is operable to process instructions synchronously with the system clock signal and a memory component coupled to the processing component through a memory control interface, the memory component receiving the system clock signal and including a sequential element that registers a memory control signal of the memory control interface based on a gated system clock signal. A clock gating element receives the system clock signal and a clock gate enable signal that is coupled to the processing component. The clock gating element is controlled by the clock gate enable signal to generate the gated system clock signal. The processing component may process an instruction associated with a predetermined memory operation. During processing of the instruction, the processing component may generate a clock enable value for the clock gate enable signal associated with the instruction prior to an execution stage of an instruction processing sequence.

According to other aspects consistent with various embodiments, the memory component performs a predetermined memory operation based on a memory enable signal input of the memory component. The processing component may generate a memory operation value for the memory enable signal at the execution stage of the instruction processing sequence. The processing component may generate an asserted clock enable value for the clock gate enable signal associated with the instruction at a pre-execution stage of the instruction processing sequence based on a determination that the instruction is associated with the predetermined memory operation. Processing of the instruction may be terminated prior to the execution stage of the instruction processing sequence based on evaluation of a specified condition.

According to other aspects consistent with various embodiments, the memory control signal may be a read address bus and the clock gate enable signal may be generated based on a determination that the instruction is associated with a memory read operation. The memory component may perform a read operation based on a read enable signal, the read enable signal being asserted for the instruction by the processing component at the execution stage of the instruction processing sequence. The memory control signal may be a write address bus and the clock gate enable signal may be generated based on a determination that the processing instruction is associated with a memory write operation. The memory component may perform a write operation based on a write enable signal, the write enable signal being asserted for the instruction by the processing component at the execution stage of the instruction processing sequence. The memory component may be a content addressable memory and the memory control signal may be a memory reference address bus, and the clock gate enable signal may be generated based on a determination that the instruction is associated with a content match operation. The memory component may perform a content match operation based on a content addressable memory enable signal, the content addressable memory enable signal may be asserted by the processing component for the instruction at the execution stage of the instruction processing sequence.

According to other aspects consistent with various embodiments, a processing device includes a processor component and a memory component, the processing component and the memory component synchronized with a system clock. A method for reducing power consumption in the processing device includes the steps of processing an instruction within the processor component, the instruction associated with a predetermined memory operation, generating a clock enable value associated with one or more memory interface signals for the instruction, the clock gate enable value generated for the instruction prior to execution of the instruction, driving the clock enable value to a clock gate enable signal associated with the one or more memory interface signals, and receiving the clock gate enable signal at a clock gate element and generating a gated system clock based on the clock gate enable signal and the system clock, the one or more memory interface signals synchronized by the gated system clock.

According to other aspects consistent with various embodiments, the method may include generating a memory operation enable value for a memory operation enable signal associated with the memory operation at an execution stage of the instruction processing sequence. The memory operation may be a memory read operation and the one or more memory interface signals may be a read address bus. The memory operation may be a memory write operation and the one or more memory interface signals may be a write address bus and/or a data input bus. The memory component may be a content addressable memory and the one or more memory interface signals may be a reference address bus. The memory operation enable value may be a non-asserted signal value based on a determination that a specified condition is not satisfied.

According to other aspects consistent with various embodiments, a computer system includes a processor for synchronously processing instructions according to an instruction processing sequence and a memory component coupled to the processor through a memory control interface. The processor synchronously processes instructions according to an instruction processing sequence, where processing an instruction includes determining a memory access operation associated with the processing of an instruction and computing a memory operation enable signal based on this determination. A clock gating signal may be associated with one or more memory interface signals of the memory control interface, the one or more memory interface signals associated with the memory access operation. A clock gate enable value for the clock gating signal may be computed at a stage of the instruction processing sequence prior to an execution stage.

According to other aspects consistent with various embodiments, the computing of the clock gate enable value may be based on the determining of the memory access operation associated with the instruction, and the determining of the memory access operation may be based on a determination that the instruction is included in a predetermined set of instructions associated with the memory access operation. The method may further include receiving the clock gating signal at the memory component and generating a gated clock signal that synchronizes input registers for the one or more memory interface signals based on the clock gating signal and a system clock signal.

BRIEF DESCRIPTION OF THE DRAWINGS

Embodiments of the present invention are illustrated in referenced figures of the drawings, in which like numbers refer to like elements throughout the description of the figures.

DETAILED DESCRIPTION

The present disclosure is generally related to reducing power consumption in a computing system integrated circuit ("IC") or central processing unit ("CPU") that employs one or more memory blocks. The memory blocks may be implemented as embedded memory arrays receiving a memory control interface. The embedded memory array may initially receive memory control interface signals such as address and data input busses in input registers and distribute these registered signals throughout the memory array. Subsequently, one or more memory operation enable signals may control corresponding memory operations using the registered control interface signals. To perform clock-gating to reduce power consumption in the input registers, the corresponding clocks could be shut down for clock cycles where memory operations using the registered signals are not performed. However, the memory operation enable signals may be timing critical paths that do not meet setup timing requirements of clock gating elements relative to the system clock. Accordingly, it may not be possible to clock gate early stage circuitry such as input registers for memory control interface signals using the associated memory operation enable signals.

Figure 3:
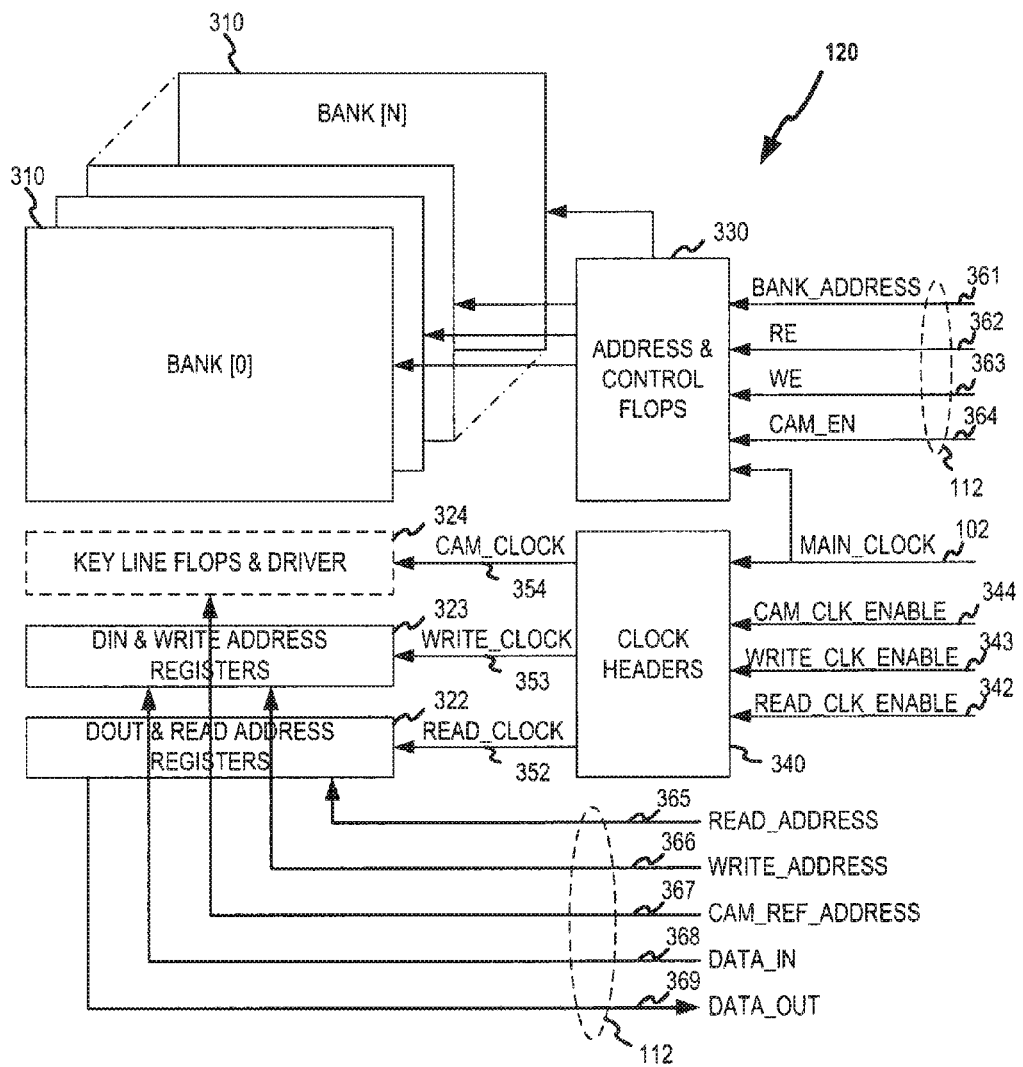
FIG. 3 illustrates a simplified block diagram of an embedded memory array, according to various embodiments.
Figure 5:
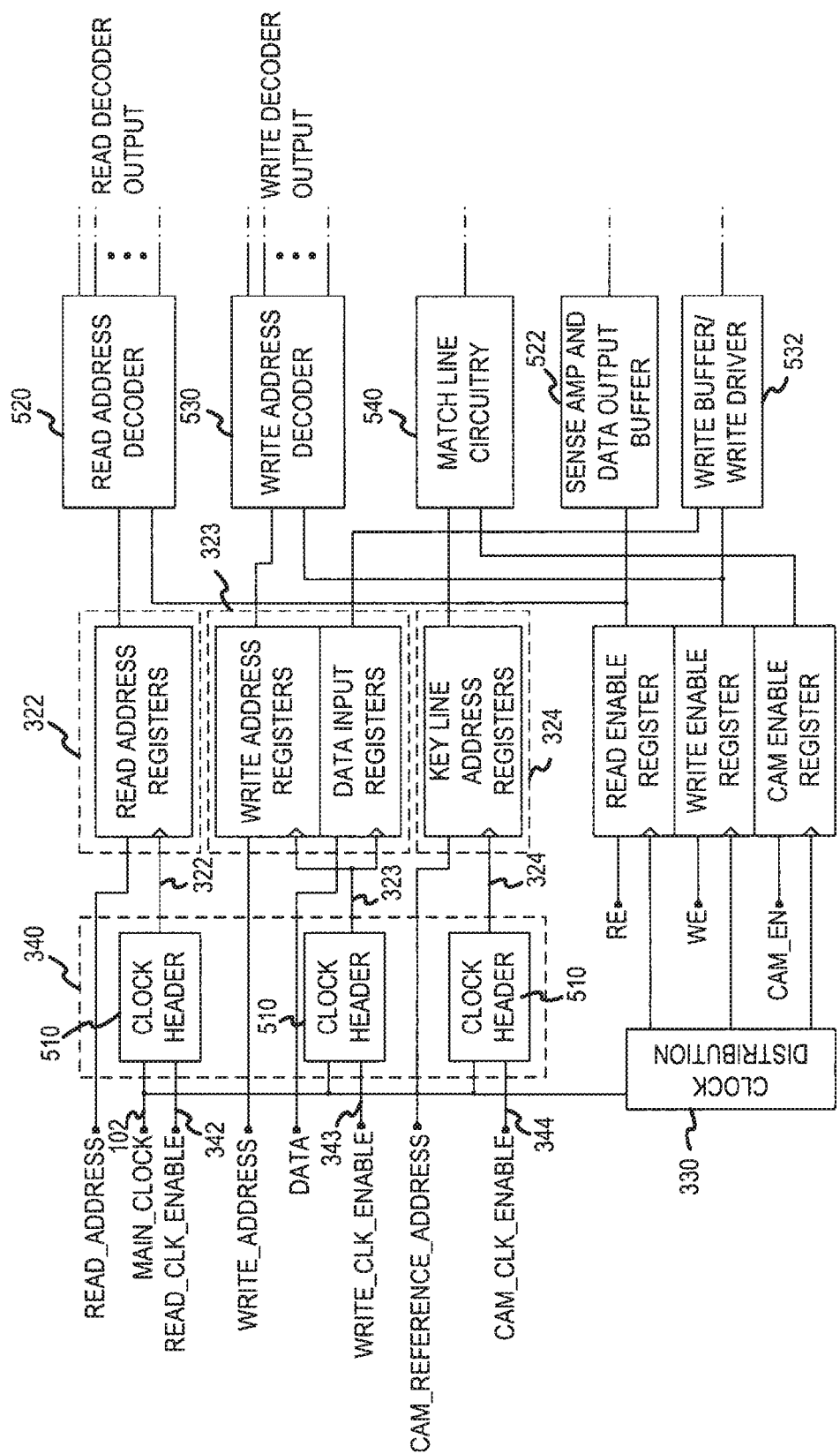
FIG. 5 illustrates aspects of an embedded memory array in more detail, according to various embodiments.
Figure 10:
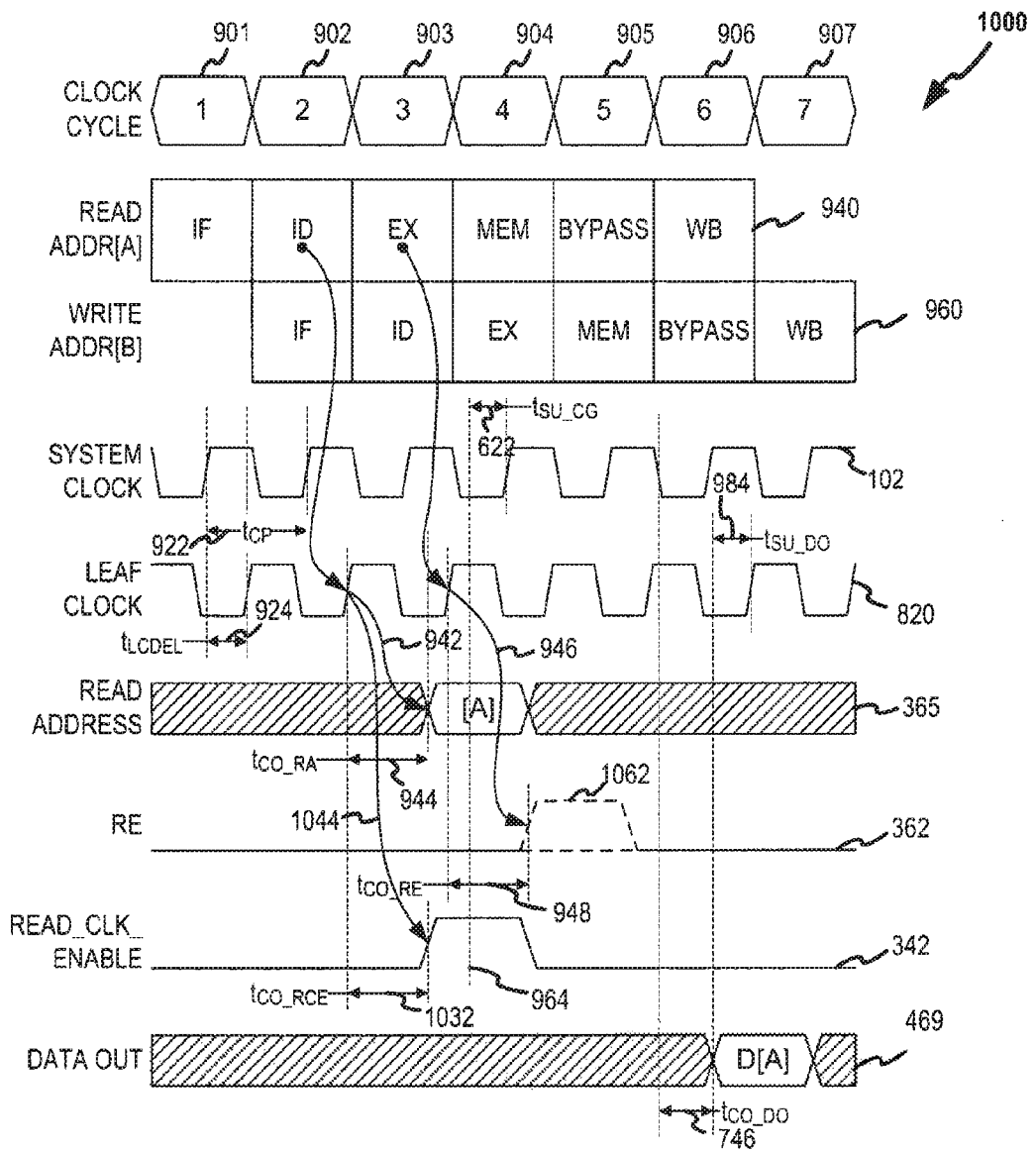
FIG. 10 illustrates another example of an instruction processing sequence for a processing core, according to various embodiments.

FIGS. 3, 5, and 10 depict novel aspects of the disclosure that reduce power consumption in an embedded memory array by clock gating input registers of the memory array even where associated memory enable signals do not meet setup time requirements relative to a system clock input of the memory array. The disclosure includes generating clock gate enable signals at processing stages of a processor core or logic circuit that are prior to (or upstream of) the evaluation of the memory enable signals that control the memory operation. For example, clock gate enable signals may be generated at instruction stages prior to evaluation of the memory operation enable signals and/or prior to conditional execution of the instruction for early stage circuitry within a memory array like data and address input registers.

While novel aspects are generally described in the context of a processor that includes one or more processor cores and one or more embedded memory arrays, the disclosure may be applied to other processing and/or logic ICs that also implement one or more embedded memory arrays on the same die as the processing and/or logic circuits and is not intended to be limited to implementation with a processor core. For example, graphics processing units ("GPUs"), complex programmable logic devices ("CPLDs"), field-programmable gate arrays ("FPGAs"), and other custom IC's commonly referred to as application specific integrated circuits ("ASICs") may include one or more embedded memory arrays.

Figure 1:
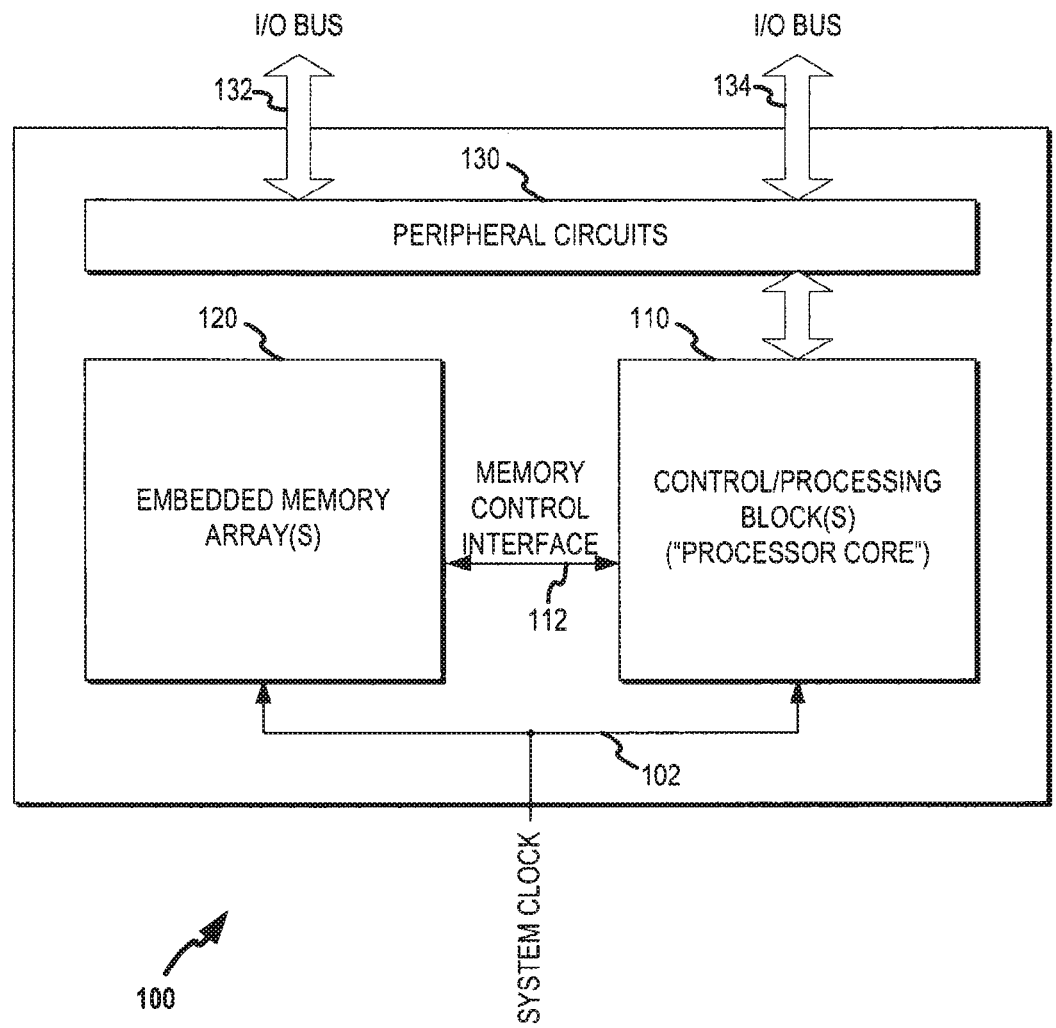
FIG. 1 shows a simplified block diagram of a computing system, according to various embodiments.

FIG. 1 shows a simplified block diagram of a computing system 100 that may implement embodiments of the invention. Computing system 100 includes one or more control/processing block(s) 110, one or more embedded memory array(s) 120, and one or more peripheral circuit(s) 130 fabricated on the same integrated circuit semiconductor substrate or "chip" (e.g., shown by the block enclosing elements 110, 120, 130 in FIG. 1). Computing system 100 may interface with other components within a computing environment through I/O buses 132 and/or 134. A system clock 102 is used for synchronous elements within control/processing block(s) 110 and embedded memory array(s) 120. The system clock 102 may be generated by on-chip circuit components, off-chip circuit components, and/or some combination of off-chip and on-chip circuit components (e.g., phase-locked loop with on-chip frequency synthesizer, on-chip frequency scaling of a reference clock, etc). Control/processing block(s) 110 communicates with embedded memory array(s) 120 through memory control interface 112.

In one embodiment, computing system 100 includes one or more processing cores 110 and one or more embedded memory arrays 120. For example, embedded memory arrays 120 may be one or more levels of cache memory (e.g., instruction cache, L1, L2, and the like), content addressable memory ("CAM"), and/or other types of embedded memory. Embedded memory arrays 120 can be, for example, SRAM, DRAM, MRAM, or another memory type. Commonly, cache memory and content addressable memory are implemented with SRAM-based memory technology.

Figure 2:
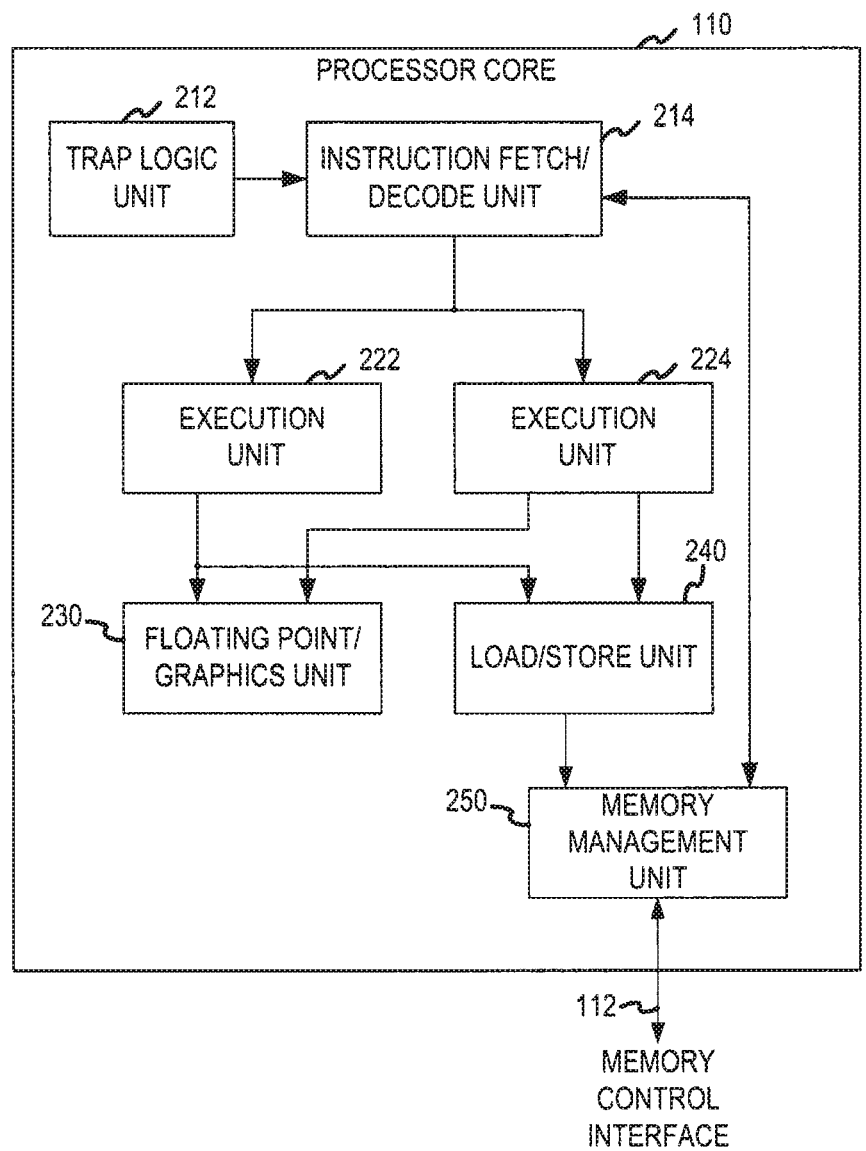
FIG. 2 illustrates a simplified block diagram of a processor core, according to various embodiments.

FIG. 2 illustrates a simplified block diagram of one embodiment of a processor core 110. Illustrated components of processor core 110 include trap logic unit 212, instruction fetch/decode unit 214, execution units 222 and 224, a floating-point and/or graphics unit 230, a load/store unit 240 and memory management unit 250. Trap logic unit 212 handles system exceptions and/or interrupts. Instruction fetch/decode unit 214 fetches instructions for processing from instruction memory. Instruction fetch/decode unit 214 may include an instruction cache and/or instruction translation lookup buffer implemented as a CAM-type memory array. Instruction fetch/decode unit 214 may also include thread selection and/or branch prediction functions. Instruction fetch/decode unit 214 then decodes the instructions to determine instruction operands and selected data sources and destinations. Execution units 222 and 224 perform arithmetic operations. Floating-point and/or graphics unit 230 performs floating-point calculations. The load/store unit 240 manages load and store operations to processor registers and memory management unit 250 communicates with a memory array through memory control interface 112. Each of these functional blocks may be implemented with a mix of combinatorial and sequential circuit elements.

Instructions may be pipelined within the processor core 110, meaning that multiple instructions are being executed at the same time, each at a different stage of the pipeline. For example, at a first clock cycle of an instruction sequence, a first instruction may be fetched by the instruction fetch unit 214. At a second clock cycle of the instruction sequence, the first instruction may be decoded while the second instruction is fetched. An instruction sequence may include several instruction stages (i.e., clock cycles) for memory operations. For example, an instruction sequence may include one or more memory access stages during which a memory operation is initiated, one or more delay or bypass stages for the memory to finish performing the operation, and one or more memory write-back stages where data from the memory may be written back to a register within the processor core. A full processor instruction pipeline (e.g., RISC or CISC instruction pipeline) may include other stages such as thread selection and management, translating instructions to micro-operations, multi-stage floating point operations, and/or other processor operations.

Because memory access is generally an important part of processing instructions, the processor instruction pipeline and the memory control sequences may be dependent on one another. For example, the number of stages in the instruction sequence may be dependent on the memory access timing. With an embedded memory with single-cycle latency (i.e., the memory can perform a memory operation in a single clock cycle) the processor core may include only one stage for performing the memory operation and a second stage for writing back data returned from the memory. For a memory with a latency of two clock cycles, a single bypass or delay stage may be inserted. Further bypass stages may be added as memory latency increases. Timing constraints of the memory control interface may be determined by parameters such as clock frequency, memory latency, memory access timing, and/or the instruction pipeline sequence.

Consider a processor core that is capable of running at a given clock frequency that interfaces with an embedded memory array through a memory control interface. In this instance, the memory array requires an absolute time period for a particular memory access operation that is greater than one clock cycle and/or one clock phase (i.e., one half of a clock cycle) at the given clock frequency. To resolve the timing issue, the clock frequency could be reduced to meet the memory timing, or, alternatively, latency of the memory could be increased by inserting an additional clock cycle or clock phase for the particular memory access operation while running the memory array at the higher clock frequency. In this regard, memory interface timing parameters are typically determined by the internal timing constraints of the memory array such as word line timing, bit-line recharging and equalization timing, sense-amplifier timing, and/or other timing constraints.

FIG. 3 is a simplified block diagram of an embedded memory array 120 according to various embodiments of the description. As the size of embedded memory blocks increases, splitting the memory array into sub-arrays or banks may provide better performance by reducing the physical dimensions of each sub-array or bank. As illustrated in FIG. 3, embedded memory array 120 includes one or more memory banks 310 that may be addressed consecutively by a BANK_ADDRESS signal 361. Embedded memory array 120 is a synchronous embedded memory that is clocked by a main system clock 102.

Embedded memory array 120 is accessed through memory control interface 112. In the embodiment illustrated in FIG. 3, memory control interface 112 includes a bank address bus BANK_ADDRESS 361, read enable signal RE 362, write enable signal WE 363, a read address bus READ_ADDRESS 365, a write address bus WRITE_ADDRESS 366, a data input bus DATA_IN 368, and a data output bus DATA_OUT 369. If embedded memory array 120 includes CAM functionality, memory control interface 112 may also include a CAM enable signal CAM_EN 364 and a CAM reference address bus CAM_REF_ADDRESS 367.

As illustrated in FIG. 3, embedded memory block 120 includes blocks to register signals from memory control interface 112 and feed the registered signals to the memory banks 310. Specifically, embedded memory array 120 includes register block 322 for read address registers and register block 323 for data input and write address registers. Embedded memory array 120 may optionally include register block 324 for CAM reference address registers (i.e., key line registers) if embedded memory array 120 includes CAM functionality.

Figure 4:
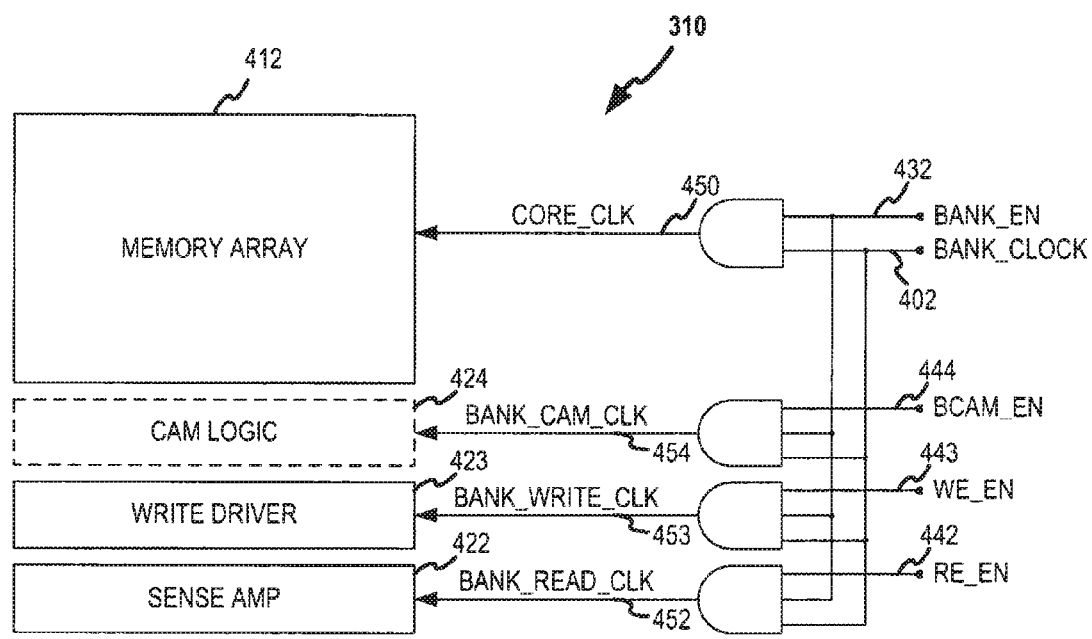
FIG. 4 illustrates circuit blocks within a bank of an embedded memory array in more detail, according to various embodiments.

FIG. 4 illustrates circuit elements within a bank 310 of embedded memory array 120 in more detail according to various embodiments of the present description. Memory bank 310 includes an array of memory cells and associated circuitry 412, sense amplifier block 422 that reads memory array 412 and write driver block 423 that drives input data to memory array 412. Optionally, if CAM functionality is present, memory block 310 includes CAM logic block 424 that performs CAM operations (e.g., associative matching functions for the CAM array).

As illustrated in FIG. 4, clocks to circuit blocks within memory bank 310 are enabled by a BANK_EN signal 432. BANK_EN 432 may be decoded from bank address signal 361 by address and control block 330 as illustrated in FIG. 3. Within the memory bank 310, the circuit blocks for writing, reading, and CAM operations are enabled by the memory control interface signals. Specifically, circuits used for reading such as the sense amplifiers in block 422 are enabled by a BANK_READ_CLK signal 452 that is a function of signal RE_EN 442, circuits used for memory write operations such as the write drivers 423 are enabled by a BANK_WRITE_CLK signal 453 that is a function of the signal WE_EN 443, and CAM logic circuits in block 424 are enabled by a BANK_CAM_CLK signal 454 that is a function of BCAM_EN signal 444. The memory operation enable signals RE_EN 442, WE_EN 443, and/or BCAM_EN 444 used in bank 310 may be a be generated by latching or registering the read enable signal 362, write enable signal 363, and the CAM enable signal 364, respectively.

Referring back to FIG. 3, register blocks 322, 323, and/or 324 include registers for input and output signals to the embedded memory array 120. Input signals for the memory control interface are synchronized with the system clock 102 in these blocks such that they can be distributed with deterministic timing to the circuits within each of the banks 310. To reduce dynamic power consumption, it is desirable to gate clock signals that synchronize input registers of the memory control interface. However, as is discussed in more detail below, the memory interface signals that are used to control operation of other memory circuits, such as memory circuits within bank 310 (i.e., RE 362, WE 363, and/or CAM_EN 364), may not have enough setup time relative to the system clock to be used for clock gating these input registers.

As illustrated in FIG. 3, embedded memory array 120 includes separate input signals READ_CLK_ENABLE 342, WRITE_CLK_ENABLE 343, and/or CAM_CLK_ENABLE 344, that are used within clock headers block 340 to generate READ_CLOCK 352, WRITE_CLOCK 353, and/or CAM_CLOCK 354, respectively. Generating these clock gate enable signals in a way that meets the setup time requirements for the memory array is discussed in more detail below.

FIG. 5 illustrates aspects of embedded memory array 120 in more detail according to various embodiments of the present description. Specifically, FIG. 5 illustrates the distribution of memory control interface signals within the memory array in more detail. Read address register block 322 synchronizes the READ_ADDRESS bus and provides the synchronized read address to the read address decoders 520. Similarly, write address registers and data registers block 323 registers the WRITE_ADDRESS and DATA_IN buses and provides the synchronized signals to the write address decoder block 530 and write buffer block 532, respectively. If the memory block includes CAM functionality, the CAM_REFERENCE_ADDRESS may be synchronized by the key line register block 324 and provided to the match line circuitry 540. The Sense amp and data output buffer block 522 may read and synchronize data in the memory array. As illustrated in FIG. 5, address and control register block 330 may distribute the system clock to the other blocks within the memory array.

FIG. 5 also illustrates clock header block 340 in more detail. Clock header block 340 includes one or more clock gate elements 510 (i.e., "clock headers"), which generate gated clock signals based on a clock signal and clock enable signal. In FIG. 5, instances of clock gate elements 510 receive the clock gate enable signals READ_CLK_ENABLE 342, WRITE_CLK_ENABLE 343, and CAM_CLK_ENABLE 344 and the main system clock MAIN_CLOCK 102 and provide gated clock signal outputs READ_CLOCK 322, WRITE_CLOCK 323, and CAM_CLOCK 324, respectively.

Figure 6A:
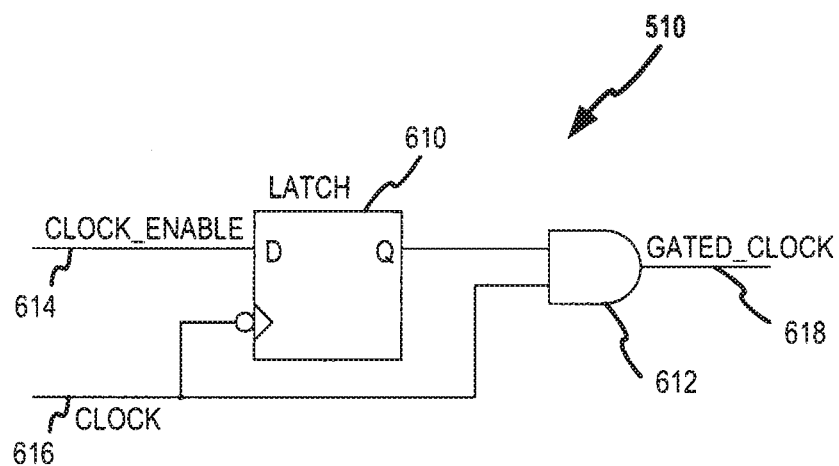
FIG. 6a illustrates an example of a clock gate element, according to various embodiments.

FIG. 6a illustrates an example of a clock gate element 510 that may be employed to gate a clock signal. The CLOCK_ENABLE signal 614 is latched by latch 610 that is transparent when the clock signal input 616 to the latch is low (i.e., the clock enable signal will propagate from the D input of the latch to the Q output of the latch when the clock input is low). As such, clock-gate element 510 is a de-glitching type clock gate. The output of the latch 610 and the clock signal 616 are then input to an AND gate 612 to produce the GATED_CLOCK signal 618.

Figure 6B:
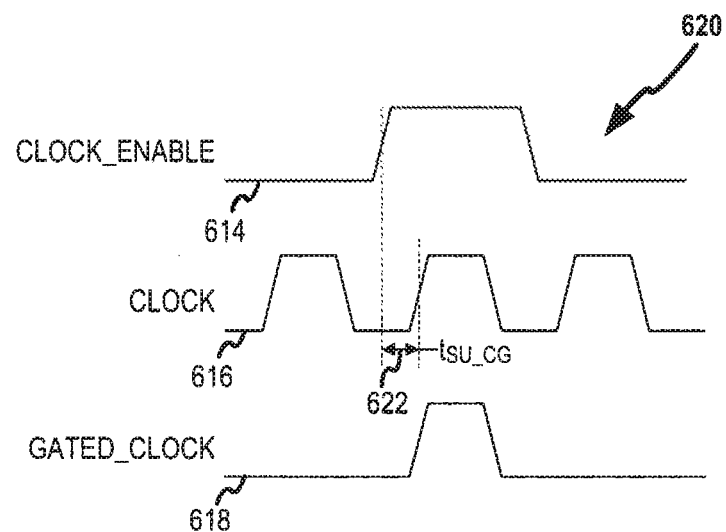
FIG. 6b illustrates a timing sequence associated with a clock gate element, according to various embodiments.

FIG. 6b illustrates a timing sequence 620 of operation of the clock gate element 510. As illustrated, the latch 610 requires a setup time period $t_{SU\_CG}$ 622 between valid assertion or de-assertion of the CLOCK_ENABLE signal 614 and the rising edge of the CLOCK signal 616. This setup time ensures that the correct state of the CLOCK_ENABLE signal 614 is captured by the latch while the latch is in the transparent state.

While FIG. 6a illustrates one type of clock-gating element, it should be appreciated that certain variations or different types of clock gate elements may be used in various instances. For example, to provide a different clock polarity, the transparent mode of the latch may be reversed and an OR gate used instead of AND gate 612. This provides an active low gated clock signal instead of the active high gated clock signal illustrated in FIGS. 6a and 6b. In addition, other types of clock-gating elements may be used in certain instances (e.g., non-deglitching clock gates, etc.). If a non-deglitching type clock gate element is used, it will be appreciated that other timing parameters should be observed to prevent other timing problems for the clock gate element or the gated clock output. For example, other timing constraints may prevent a truncated pulse width on the gated clock output that may violate other timing parameters of sequential elements driven by the gated clock signal (e.g., minimum pulse width and the like).

Figure 7:
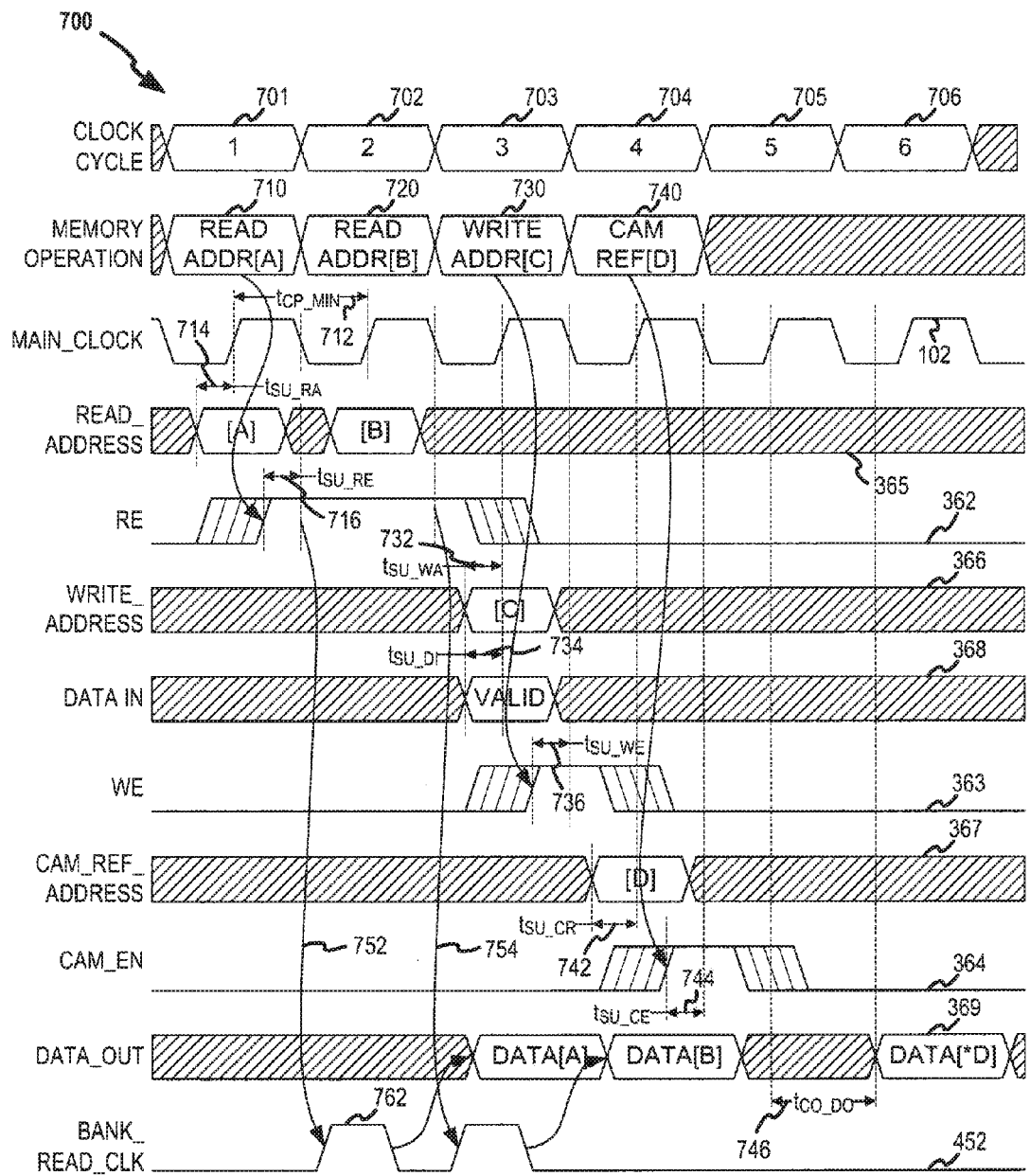
FIG. 7 illustrates a memory timing sequence that includes various memory timing parameters of an embedded memory array, according to various embodiments.

FIG. 7 shows a memory timing sequence 700 that illustrates various memory timing parameters of an embedded memory array 120 according to various embodiments of the description. Specifically, memory timing sequence 700 illustrates various memory control operations and a subset of the timing parameters that should be met to ensure correct memory operation for certain operations. For simplicity, memory timing sequence 700 illustrates only some of the signals of memory control interface 112 as well as only a subset of the required timing specifications for correct memory operation.

As described above, embedded memory array 120 may be clocked by system clock 102. The timing parameter $t_{CP\_MIN}$ 712 may indicate the minimum clock period required by the embedded memory array 120. The maximum operating frequency of the embedded memory is determined by the inverse of the minimum clock period. For example, a time period $t_{CP\_MIN}$ of 1.0 nanosecond ("ns") provides a maximum embedded memory operational frequency of 1.0 GHz.

To illustrate example memory timing parameters, memory timing sequence 700 includes a sequence of memory operations. In a first memory operation 710 of memory timing sequence 700, a read of memory address A is initiated. In a second memory operation 720, a read of memory address B is initiated. In a third memory operation 730, a write to memory address C is initiated. In a fourth memory operation 740, a CAM reference operation using reference address D is initiated. While the memory operations are illustrated in FIG. 7 relative to the clock cycle on which the operations are initiated, it should be understood that the memory operations typically take several clock cycles to complete.

The first memory operation 710 begins at a first clock cycle 701 of memory timing sequence 700. At this first clock cycle 701, the memory address to be read (i.e., address A) is provided to the embedded memory array 120 through the read address bus 365. For a read operation initiated at clock cycle 701, various timing parameters should be met by memory control interface signals associated with the read operation to ensure the correct synchronous memory operations. Specifically, time period $t_{SU\_RA}$ 714 indicates the setup timing requirement for the read address bus 365 relative to the rising edge of the system clock 102 in clock cycle 701. As discussed above, the read enable signal RE 362 may be used to generate memory control signals within the memory banks. Therefore, performing a read operation may also include asserting the read enable signal RE 362 during memory timing sequence 700.

For a variety of reasons, the memory operation enable signal associated with the read operation initiated in clock cycle 701 may not be required to be asserted at the same time as other memory control interface signals associated with the memory read operation. Referring back to FIGS. 3 and 4, the memory enable signals RE 362, WE 363, and/or CAM_EN 364 may be distributed to component blocks of the embedded memory array to control memory operation circuits. As illustrated in FIG. 3, these signals may be distributed to the memory banks to control memory operations such as enabling the word lines and/or sense amplifiers.

The timing of internal signals to the memory array (i.e., time required to route the addresses internally to the memory array, word line timing, sense amplifier enable timing, bit line equalization timing, and the like) may determine the relative timing requirements for the address, data, and enable signals at the memory interface. For example, in a typical memory operation, the read or write address is decoded to circuits associated with selected memory rows before the word lines are activated for a read or write memory operation. Referring back to FIG. 5, this means that read address decoder 520 receives and decodes the read address from the read address registers 322 before the word lines are enabled for a read operation. Similarly, the write address decoder 530 receives and decodes the write address from the write address registers 323, and the write drivers 532 receive the data from the data address registers 323 before the word lines are enabled for a write operation. CAM operations may require similar decoding or setup of input address and/or data through the match line circuitry 540 before a word line is enabled for a CAM memory operation. In addition, clock distribution to the memory banks may internally delay the clock signal within the banks before it is used to drive the bank memory operation signals such as word lines, sense amp enable, and the like. Accordingly, timing parameters for memory operation enable signals may be different than timing parameters for other memory control interface signals. Commonly, timing parameters for memory operation enable signals may be delayed relative to a system clock or referenced from different clock cycles or phases within the memory interface control sequence.

In memory timing sequence 700, the read enable signal RE 362 may be gated in bank 310 by a BANK_CLOCK signal 402 that is the inverse polarity of the system clock 102. In this instance, the timing parameters for the read enable signal RE 362 may be relative to the falling edge of the system clock at the end of clock cycle 701 for read operation 710. In memory timing sequence 700, pulse 762 of the bank read clock signal BANK_READ_CLK 452 occurs during the low phase of the system clock if RE 362 as a result of the assertion of read enable signal RE 362 meeting setup time period $t_{SU\_RE}$ 716 before the falling edge of the system clock 102 preceding that phase. Arrows 752 and 754 indicate the relationship between the system clock 102, the read enable signal RE 362, and the BANK_READ_CLK signal 452 for read operations 710 and 720, respectively. In this example, RE 362 may be latched during the time period that the system clock 102 is high to generate the RE_EN 442 input to bank 310 that is used as an input to an AND gate that drives the BANK_READ_CLK signal 452 as illustrated in FIG. 4. In a similar manner, the CORE_CLK signal 450 may be generated by latching a decoded bank address to generate the BANK_EN signal 432.

In this regard, the timing requirements for memory operation enable signals RE 362, WE 363, and/or BANK_EN 364 may be described as offset by a clock phase from the timing requirements for other memory control interface signals associated with these memory operation enable signals. However, other timing relationships between the memory operation enable signals and associated memory control interface signals are within the scope of the description. For example, timing requirements for memory operation enable signals may be offset by one or more clock cycles and/or clock phases of the system clock from the timing requirements for other memory control interface signals. In other embodiments, the timing requirements for memory operation control signals such as the read enable signal RE 362 are relative to a bank clock signal (e.g., bank clock signal BANK_CLOCK 402, etc.) that is delayed by clock distribution internal to the memory array (e.g., clock distribution to the memory banks and the like). Alternatively, timing requirements for memory operation enable signals may be relative to the other memory control interface signals themselves and/or another clock signal. In each of these instances, timing parameters associated with a particular memory operation may include an offset between a setup time requirement for a memory operation enable signal and other memory control interface signals associated with the particular memory operation.

As illustrated in FIG. 7, at the falling edge of the system clock 102 at the beginning of the second clock cycle 702, the BANK_READ_CLK 452 is pulsed to read memory address A. For example, the word line pulses may occur during this phase of the system clock, and the sense amplifiers may be enabled during or at the end of this clock phase. At the end of the BANK_READ_CLK pulse, the data from the memory cells of memory address A may be available on the bit lines of the memory array and read out by the sense amplifiers. Therefore, the memory control signals including read enable signal RE 362, write enable signal WE 363, and/or CAM enable signal CAM_EN 364 may not be used within the memory array until one or more clock phases after the input registers of the memory array capture input address and data signals.

FIG. 7 shows that timing for write and CAM operations may be similar to timing of read operations discussed above. For example, for write operations such as the write to memory address C illustrated in memory timing sequence 700, write address bus 366 and data input bus 368 may be required to be valid at least time periods $t_{SU\_WA}$ 732 and $t_{SU\_DI}$ 734 before the rising edge of the system clock. Because the write enable signal 363 may be used later in the write operation sequence (e.g., after the data is driven to bit-lines and the write address is fully decoded), the write enable signal may have more setup time relative to the write address and data input buses. As illustrated in memory timing sequence 700, if the write address and data input buses are registered by the memory block at the rising edge of the system clock during clock cycle 703, the write enable signal 363 should be asserted at least a time period $t_{SU\_WE}$ 736 before the next falling edge of the system clock 102 to meet setup time requirements. Similarly, for the CAM operation 740 in memory timing sequence 700, the CAM reference address bus CAM_REF_ADDRESS 367 may be required to be valid at least a time period $t_{SU\_CR}$ 742 before the rising edge of the system clock 102 in clock cycle 704, while the CAM enable signal CAM_EN 364 may be required to be valid at least a time period $t_{SU\_CE}$ 744 before the next falling edge of the system clock 102.

For memory operations where data is returned from the memory block to the processor block (e.g., read, CAM operations), the memory operation may take additional time periods before the processor can receive the memory output data on the data output bus DATA_OUT 369. As illustrated in memory timing sequence 700, the time period $t_{CO\_DO}$ 746 provides the time period between the rising edge of the next clock cycle after the first clock cycle of the memory operation and valid data present on the data output bus 369. For example, CAM operation 740 is initiated on clock cycle 704 of memory timing sequence 700 (i.e., the CAM reference address 367 is valid at clock cycle 704), and the information retrieved by the CAM operation is valid a time period $t_{CO\_DO}$ 746 after the rising edge of the system clock 102 during clock cycle 705. At this time, the data is available for the processor core, for example, the DATA_OUT bus 369 could be registered by the processor core at clock cycle 706.

Figure 8:
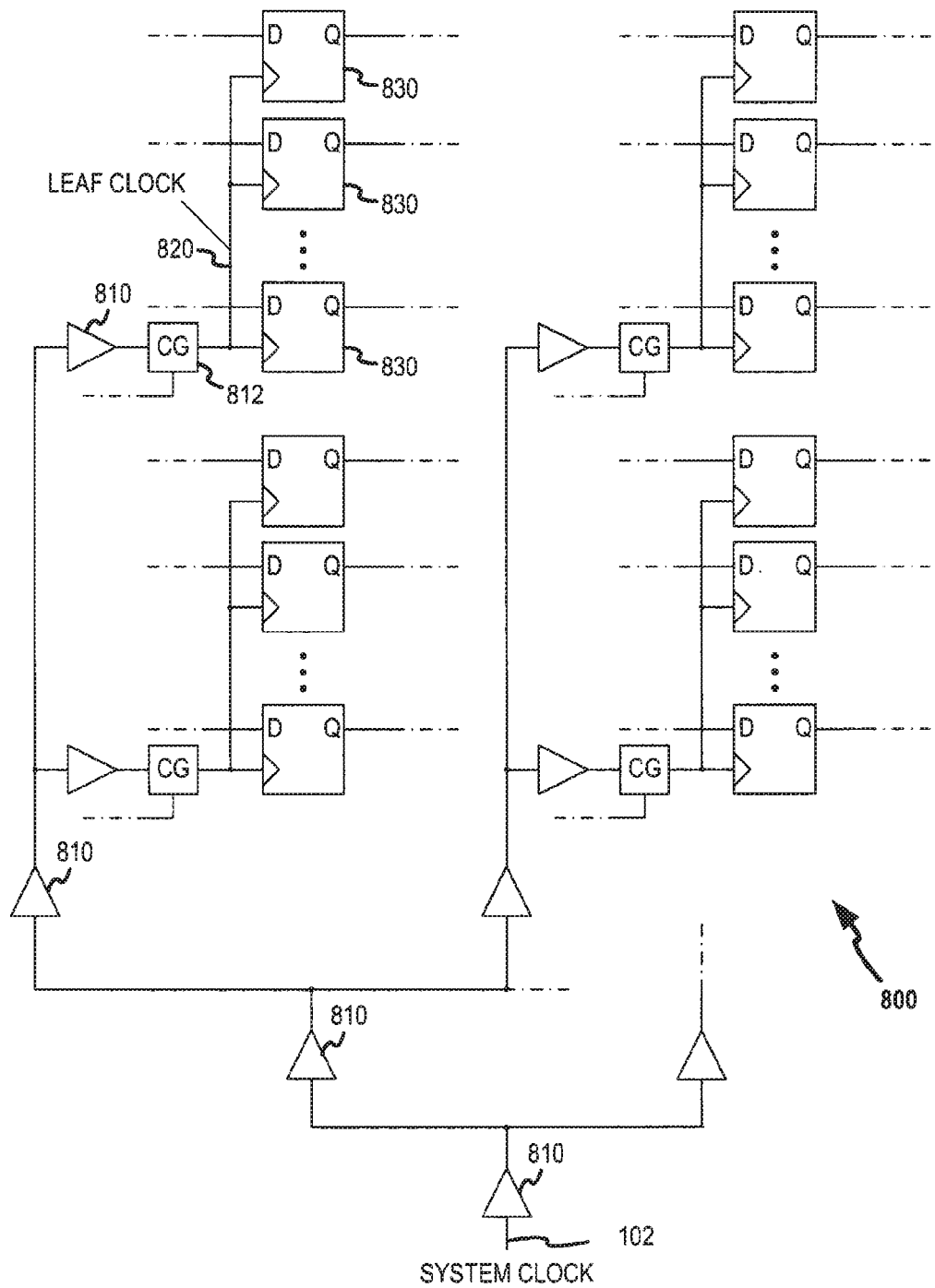
FIG. 8 illustrates an example clock tree that may be used to route a system clock to sequential elements within a processing block, according to various embodiments.

As processors and other logic circuits become increasingly complex, they include an increasing number of sequential elements (i.e., registers or "flip-flops"). Routing the system clock to the large numbers of sequential elements within the processing block requires a large fan out from the system clock. FIG. 8 illustrates an example clock tree 800 that may be used to route the system clock 102 to sequential elements within a processing block. Clock tree 800 includes one or more levels of clock buffers 810 in a tree-like configuration that distributes the system clock signal 102 as a network of leaf clock signals 820. Each leaf clock signal 820 drives one or more sequential elements 830.

Sequential elements 830 and/or combinatorial logic between the sequential elements of the processing block may be custom blocks and/or standard cell blocks. The physical layout of sequential elements and combinatorial logic within the processing block may be manually placed and routed or automatically placed and routed by place and route CAD software. Within a custom or placed and routed standard cell block, clock tree 800 may be manually created or automatically created by the place and route software. For a large processing or logic block, the clock tree may include multiple levels of clock buffers 810. For example, four to six levels of clock buffers 810 within a large processing block is not uncommon. Therefore, the leaf clocks 820 may be delayed significantly from the system clock signal 102. For example, leaf clock delay may be on the order of 50-400 picoseconds ("ps") for four to six levels of clock buffers in a modern IC process technology.

Within the processing block, clock delay from the system clock 102 is balanced between leaf clocks such that clock skew between leaf clocks is below a maximum allowable clock skew. Accordingly, delay between the leaf clocks and the system clock does not cause any problems within the processing block because sequential elements are provided with leaf clocks that have similar leaf clock timing. In some embodiments, clock gate elements 812 may be inserted to gate particular leaf clocks to reduce dynamic power consumption in the processing block. The clock gate elements may be automatically inserted and/or manually instantiated. As described above, the clock gate elements 812 may add further delay between the system clock 102 and the leaf clocks 820.

Leaf clock delay within a processing block affects timing between the processing block and an embedded memory block that may be driven by the system clock. Specifically, signals of a memory control interface that are clocked by the leaf clock within the processing block will be delayed by the leaf clock delay in addition to other delays within the processing block (e.g., clock-to-out delay, routing delay, and the like). Therefore, these signals may be substantially delayed relative to the system clock input to the embedded memory array.

Figure 9:
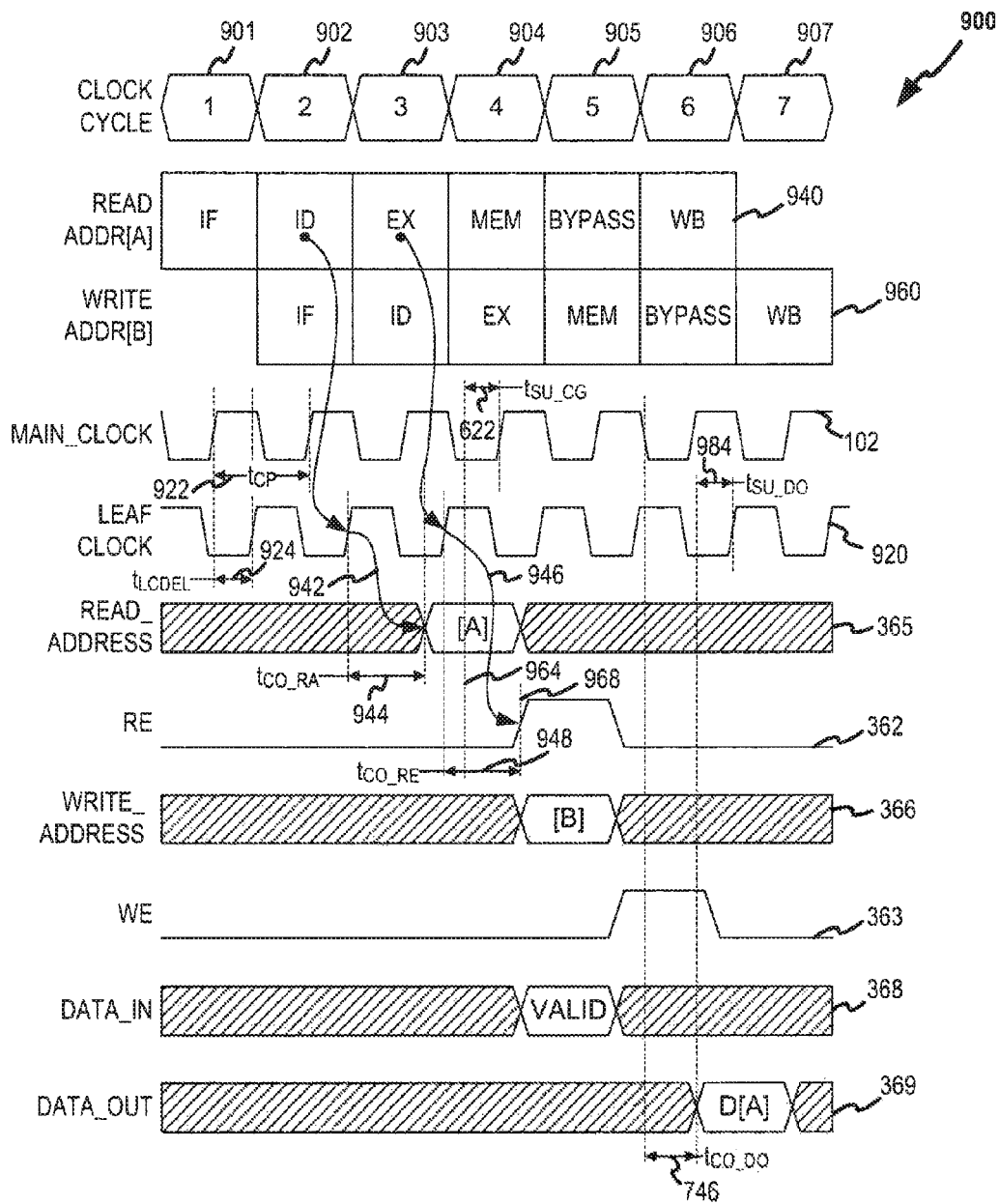
FIG. 9 illustrates an instruction processing sequence for a processing core, according to various embodiments.

FIG. 9 shows an instruction processing sequence 900 for a processing core 110 that illustrates timing between a processor core 110 and an embedded memory array 120 according to various embodiments of the present description. In instruction processing sequence 900, processor core 110 performs a sequence of processing operations. Specifically, processor core 110 performs processing of a first instruction 940 that includes a read operation of address A of embedded memory 120 and a second instruction 960 that includes a write operation to address B of embedded memory 120. The instruction processing is shown relative to the clock cycle sequence including clock cycles 901, 902, 903, 904, 905, 906, and 907 in sequential order. Processing of the second instruction 960 is pipelined one processing stage behind the first instruction 940.

In instruction processing sequence 900, the system clock 102 has clock period represented by time period $t_{CP}$ 922. The time period $t_{CP}$ equals the inverse of the system clock frequency. For example, for a 1.0 GHz system clock, time period $t_{CP}$ 922 equals 1.0 ns. As illustrated in FIG. 9, leaf clock 920 may be delayed by time period $t_{LCDEL}$ 924 from system clock 102 through the clock tree and/or internal clock-gating of the processor core 110. For example, processor core 110 may have sequential elements that are clocked by leaf clocks generated by a clock tree that is similar to clock tree 800 illustrated in FIG. 8. Time period $t_{LCDEL}$ 924 of leaf clock 920 causes an equal delay in propagation of signals driven by blocks clocked with leaf clock 920 relative to the system clock 102, including signals associated with the memory control interface 112.

Instruction processing sequence 900 illustrates the processing stages of each instruction relative to the system clock. For example, clock cycle 901 is illustrated from a falling edge of the system clock 102 to the next falling edge of the system clock 102. The instruction fetch stage of the first instruction 940 is illustrated as occurring during this clock cycle. However, as discussed above, leaf clock 920 may be delayed because of the clock buffer tree within the processor core. For this reason, signals clocked by the leaf clocks within the processor core may be delayed by a leaf clock delay $t_{LCDEL}$ 924 from the system clock 102, as illustrated in FIG. 9.

In addition, signals that are driven from the processor core 110 including memory control interface signals 112 may have a delay time associated with propagation through the sequential elements and to an output port. This time period may be a result of clock-to-out delay within the sequential elements, combinatorial logic after the sequential elements (e.g., delays through MMU, and the like), delay within buffers that drive the memory control signal output port, and/or routing delay from the location of the sequential element within the processor core to the embedded memory array. For read address bus 365, this time period is represented as time period $t_{CO\_RA}$ 944. For read enable signal 362, this time period is represented as time period $t_{CO\_RE}$ 948.

Timing of various signals of the memory control interface 112 relative to the instruction sequence and/or system clock signal may be different. One condition that causes differences in memory control signals relative to the instruction sequence (i.e., the relative clock cycles and phases within the instruction sequence) is that values for various signals of the memory control interface 112 may be computed at different stages of the instruction pipeline in processor core 110. In addition, relative timing differences of memory control signals may exist even for memory control signals that are computed at the same clock cycle and clock phase.

Differences in memory control signals associated with the processing of a particular instruction relative to the instruction sequence may occur where a value associated with one memory control signal (e.g., memory address) may be computed or evaluated for the instruction at a different time than the value associated with another memory control signal (e.g., read enable). One reason this may occur is where some values associated with an instruction can be determined from the decode phase of the instruction pipeline, while other values are determined during the execution phase of the instruction pipeline. Another reason this may occur is where some information for a memory operation is available throughout processing of a particular instruction while other information may be computed during processing of the instruction. For example, some information for a memory operation performed during an instruction may have been computed during a previous instruction and stored in a static register of the processor core 110. Yet another reason for differences in memory signal timing is the evaluation of conditional instructions. In this instance, some values associated with certain memory control signals may be computed or determined during the instruction fetch or decode cycles of the processing sequence, while conditional values associated with other memory control signals are evaluated during cycles associated with instruction execution.

Another cause for differences in timing of various signals of memory control interface 112 is differences in combinatorial logic within the processor core 110 between the sequential elements in the processor core and the output port for the signal. For example, the time period $t_{CO\_RE}$ 944 may be different from the time period $t_{CO\_RE}$ 948. Specifically, there may be more combinatorial logic or other processing that occurs within the processor core 110 for the enable signals than for address or data signals. For example, additional processing or logic for the enable signals may occur within the store/load block or MMU block of the processor core 110. In this regard, even if evaluated at the same clock cycle of the instruction processing sequence, the read enable and/or write enable signals may have more delay relative to the system clock than address or data buses of the memory control interface.

As discussed above, it may be desirable to clock-gate the memory control interface input registers for the memory address buses (e.g., bank address, read address, write address, CAM reference address) or for the memory data bus (e.g., data input bus) to reduce dynamic power consumption in the embedded memory array. For clock cycles where these data buses are not currently active, the clock signals to these data buses could be gated off, reducing the dynamic power consumption of the embedded memory array. For example, when the processor core 110 is not in the process of performing a memory read operation (i.e., when a specific clock cycle is not used to register a memory address for a memory read operation performed by assertion of the read enable signal RE 362), the embedded memory block does not need to register the current state of the read address bus. Other possible gating conditions include gating the clock signal to the input registers for the data input bus 368 and/or write address bus 366 when the processor core 110 is not in the process of performing a memory write operation and/or gating the clock signal to the CAM reference address registers when the processor is not asserting the CAM enable signal. However, referring back to FIGS. 7-9, signal timing of the memory control signals may not allow enough setup time to insert clock gates for one or more of the conditions described above.

It may be useful to consider the processing of a conditional read instruction 940 during instruction processing sequence 900 as may be illustrated by FIG. 9. According to this embodiment, the conditional read instruction 940 is fetched at a first clock cycle 901 and decoded at a second clock cycle 902 of instruction processing sequence 900. At this stage, the address of the embedded memory block to be read during processing of the instruction (i.e., memory address A) is computed, as illustrated by processing step 942. Therefore, after the instruction decode stage at clock cycle 902, the read address bus 365 may be driven to memory address A. As illustrated in FIG. 9, the read address bus is driven to memory address A at a time period $t_{CO\_RA}$ 944 after the rising edge of leaf clock 920 associated with clock cycle 902. However, in instruction processing sequence 900, the condition associated with the read enable signal 362 is evaluated during the instruction execution stage at clock cycle 903. Therefore, as illustrated by processing step 946, the read enable signal 362 is asserted after the instruction execution stage at clock cycle 903. Specifically, the read enable signal transitions states a time period $t_{CO\_RE}$ 948 after the rising edge of leaf clock 920 associated with clock cycle 903.

While the read enable signal RE 362 may be delayed relative to the read address signal READ_ADDRESS 365 in instruction processing sequence 900, this may provide valid timing for a read operation of an embedded memory array. Specifically, an embedded memory array as described with reference to FIGS. 3-5 may register and/or otherwise require the read address READ_ADDRESS 365 to be valid at a time period before the read enable signal RE 362 is required to be asserted for a memory read operation. For example, the read address signal READ_ADDRESS 365 may be registered at a rising edge of the system clock 102 during a first clock cycle 701, while the read enable signal RE 362 may not be required to be asserted for a read operation until some time period after the rising edge of the system clock at the first clock cycle 701. In one embodiment, the read enable signal RE 362 may be required to be asserted at least a time period $t_{SU\_RE}$ 716 before the falling edge of the system clock 102 after the read address signal READ_ADDRESS 365 is registered. In other embodiments, the read enable signal RE 362 may be required to be asserted at least a time period $t_{SU\_RE}$ 716 before the rising edge of a bank clock signal (e.g., BANK_CLOCK 402, etc.) that is a delayed version of the system clock signal. Therefore, the timing of read address signal 365 and read enable signal 362 driven by processor core 110 as illustrated in FIG. 9 provides a valid read operation initiated at clock cycle 904 although the read address is not asserted until after the rising edge of the system clock during the MEM instruction stage at clock cycle 904.

As illustrated in FIG. 9, memory control signals associated with memory write operations may have similar timing to read operations. For example, the address to be written (i.e., address B) and data value to be written may be evaluated during the instruction decode stage of processing write instruction 960 (i.e., clock cycle 903), while the write enable signal is evaluated during the execution stage (i.e., clock cycle 904). Timing for signals associated with CAM operations may also have similar differences.

As discussed above, it may be desirable to add clock gating to clock signals that drive registers of the embedded memory block that register various memory input signals. However, referring back to FIGS. 6a and 6b, inserting a clock gate element (e.g., clock gate element 510) for clock signals to these input registers requires certain timing parameters to be met for valid operation of the clock gate element. Specifically, the clock gate enable signal may be required to meet a setup time requirement relative to the clock signal as illustrated in FIG. 6b.

Returning to FIG. 9, to gate the clock signal to the input registers for the read address signal 365 with the read enable signal 362, the read enable signal 362 may be required to be validly asserted at least at time period $t_{SU\_CG}$ 622 before the rising edge of the system clock signal 102 during the memory access stage for the first instruction 940 (i.e., clock cycle 904). In instruction processing sequence 900, this time is illustrated by line 964. However, as can be seen in FIG. 9, the read enable signal 362 is not validly asserted until a time illustrated by line 968. Therefore, the read enable signal 362 does not have enough setup time to be used as the clock enable signal for insertion of a clock gate element such as clock gate element 510 to gate the clock signal to the input registers for the read address bus 365.

It may be appreciated with reference to FIGS. 7 and 9 that delay could be inserted in the memory block or elsewhere between the system clock 102 and the embedded memory array 120 to increase setup time between the read enable signal and the clock within the embedded memory array. This technique could be used to delay the clock within the memory array until the memory enable signals could be used as clock gate enable signals for the input registers of the memory array. However, as indicated by FIG. 9, because of the clock-to-out delay time period $t_{CO\_DO}$ 746 of the memory array, and the setup time requirement of registers within the processor core, the output path of the memory array may also be a constrained path. Specifically, delaying the clock within the memory array may reduce or eliminate timing margin for data coming back from the memory array to the processor core. Therefore, it may not be possible to add enough delay to the clock used in the memory block such that one or more memory enable signals could be used as a clock gate enable to input registers of the memory array without incurring other timing violations.

As illustrated in FIG. 9, processors typically process instructions within a multi-clock cycle instruction pipeline. For a variety of reasons, an instruction may be processed through part or all of an instruction pipeline without completing a memory operation that is associated with the instruction. For example, instructions may be fetched and/or decoded before it is determined that a previous instruction causes a modification of the control flow of the associated programming instructions. The modification of the control flow may occur as a result of a branching instruction (e.g., jump, conditional jump, and the like). Other changes to the control flow may occur because of speculative thread execution, in which a program thread is executed based on a prediction that the program will branch to the thread. If the prediction turns out to be in error, the thread is invalidated and the instruction pipeline is flushed. Additionally, the memory operation within a particular instruction may be conditional. That is, if a condition associated with the instruction does not evaluate to a certain result, the memory operation is not actually performed.

FIG. 10 shows an instruction processing sequence 1000 that uses pre-execution memory operation enable signals to resolve the timing considerations for gating clocks feeding input registers for memory control interface signals of an embedded memory array, according to various embodiments. As with instruction processing sequence 900, instruction processing sequence 1000 illustrates processing of a first instruction 940 that performs a memory read operation and a second instruction 960 that performs a write operation. Also, similar to instruction processing sequence 900, the leaf clock delay $t_{LCDEL}$ 924 delays the leaf clocks 920 within the processing core 110 such that the sequential elements within the processing core (including the sequential elements that register memory control signals at the various processing instruction stages) are clocked by the rising edges of the leaf clock 920 as illustrated.

As described above, for various reasons the memory enable signals such as read enable, write enable, and/or CAM enable may be delayed relative to other signals of memory control interface 112. In one embodiment, the read address (address A) for the memory read operation is computed during the instruction decode stage at clock cycle 902. Process step 942 illustrates that the read address bus 365 is driven to a value associated with the first instruction 940 (i.e., address A) at a time period $t_{CO\_RA}$ 944 after the rising edge of the leaf clock 920. As with instruction processing sequence 900, the read enable signal is evaluated during the execution stage during clock cycle 903. Processing step 946 indicates that the read enable signal is driven to the evaluated memory operation functional value 1062 a time period $t_{CO\_RE}$ 948 after the rising edge of the leaf clock associated with clock cycle 903. As illustrated in FIG. 10, the read enable signal 362 may be driven to an asserted state or a non-asserted state (e.g., high state or a low state depending on input signal polarity) as a result of conditional execution of instruction 940 (e.g., jump of a previous instruction, branch prediction error, etc.) and/or evaluation of an instruction condition during the execution stage of instruction 940. As discussed above, the state of the read enable signal RE 362 shown by memory operation functional value 1062 will determine whether a memory read operation actually occurs. For example, in the embodiment of FIG. 7, a read occurs when the read enable signal 362 is asserted before the falling edge of the system clock (meeting setup timing parameter $t_{SU\_RE}$ 716). At the next clock phase, the word line corresponding to the decoded read address, as well as the sense amplifiers, will be enabled as shown by high pulses on BANK_READ_CLK. The data read from the embedded memory array by the sense amplifiers will be driven to the DATA_OUT bus 369 according to the timing illustrated in FIG. 10.

As illustrated in FIG. 10 by processing step 1044, the READ_CLK_ENABLE signal 342 is generated prior to computation of the read enable signal RE 362 at the execution stage for instruction 940. Specifically, the READ_CLK_ENABLE signal 342 is asserted if a read may occur as a result of execution of instruction 940 and/or evaluation of a condition of instruction 940 that determines whether the read enable signal RE 362 is asserted. That is, READ_CLK_ENABLE 342 is driven by a pre-execution stage and/or pre-evaluated conditional enable of the instruction 940. For example, the pre-execution stage and/or pre-evaluated conditional enable may be computed during the instruction decode stage at clock cycle 902 by a determination that instruction 940 is associated with a memory read operation. In one embodiment, the clock gate enable signal may be asserted based on a determination that the instruction is in a sub-set of instructions of the processor that are associated with memory read operations. The sub-set of instructions may include instructions that are associated with conditional read operations and/or non-conditional read operations. As illustrated in FIG. 10, READ_CLK_ENABLE 342 meets setup timing for clock gating of input registers associated with a read operation. Specifically, READ_CLK_ENABLE is asserted before a time that meets the clock gate setup time $t_{SU\_CG}$ 622 to the system clock 102, illustrated in FIG. 10 by the time indicated by line 964.

Because the READ_CLK_ENABLE signal 342 is generated from the pre-execution stage and/or pre-evaluated condition that determines the read enable signal RE 362, in some instances the READ_CLK_ENABLE signal 342 will be asserted when the instruction does not evaluate to result in a memory read operation. In these instances, the READ_CLK_ENABLE signal 342 will still be asserted and the clock signal to the read address registers will be active for the corresponding clock cycle. As such, the read address registers will capture the value on the read address bus READ_ADDRESS 365 for this clock cycle. However, the circuitry within the memory array (e.g., circuits with the bank 310 and the like) will not process the read operation because the read enable signal RE 362 is not asserted in association with the captured read address. Therefore, the extra data register operation does not cause any difference in actual memory operation.

As with the read operation illustrated in FIG. 10, the clock enable signal WRITE_CLK_ENABLE 343 may be generated from a pre-execution stage instruction parameter and/or a pre-evaluated condition of a processor instruction. For example, WRITE_CLK_ENABLE 343 may be asserted based on determining that an instruction may perform a memory write operation. WRITE_CLOCK 353 will therefore be activated during the memory stage of the processor instruction sequence (e.g., the MEM stage at clock cycle 905 as illustrated in FIGS. 9 and 10). As a result, the value of the write address bus 366 and/or data input bus 368 will be captured in the input registers of the memory array. If, for the reasons described above, the instruction does not actually perform a write operation (i.e., the write enable signal WE 363 is not asserted), the memory address will not be written with the captured data. Therefore, registering the write address for an instruction that does not evaluate to actually perform a write operation does not erroneously affect memory locations because the write operation (i.e., assertion of the memory address word line to write the data on the write address bus to a particular memory location) is not actually performed.

If the embedded memory array 120 includes CAM functionality, the CAM_CLK_ENABLE signal 344 may be generated in a similar manner to the READ_CLK_ENABLE signal 342 and WRITE_CLK_ENABLE signal 343 as describe above. As with read and write operations, the actual CAM operations are not modified because the CAM_EN signal 364 controls the CAM circuitry that performs CAM logic operations according to the original functionality.

The techniques described above for generating a pre-execution stage and/or pre-evaluated conditional memory operation enable signals for clock gating early-stage embedded memory array circuitry can be used where the memory operation enable for an instruction is computed at a stage in the instruction processing sequence after the address or data values are available. This instance may be illustrated by processing steps 942 and 946 of FIG. 9, where the read enable signal 362 is computed at a later instruction stage than is the memory address location driven on the read address bus 365. However, the techniques described above for providing a pre-evaluated memory operation enable signal to clock gate early stage circuits of the memory array may be used in other circumstances. For example, these techniques may be used where the address and/or data information for memory operations are computed at the same clock cycle as the enable signal, but the timing of the memory operation enable signal is delayed further relative to the system clock. One reason that memory operation enable signals may have more delay is that these signals may be generated as a result of several computed values, and therefore include more combinatorial logic after registering. Because of this delay, the memory operation enable signals may not meet a setup time that would be required to insert clock gate elements for early stage registers of the memory array enabled by these signals. According to the techniques described above, pre-evaluated memory operation enable signals may be generated that include all of the functional conditions of the memory operation enable signals, as well as other conditions because they are generated earlier in (or upstream of) the instruction sequence than the fully evaluated memory operation enable signals. In this instance, the input registers may be enabled for more clock cycles than necessary (i.e., when the clock gate enable signal associated with a memory operation is asserted based on pre-execution stage instructions or pre-evaluated conditions within an instruction that, when evaluated, result in no functional memory access associated with the instruction). As described above, these false-positive clock gate enable assertions do not affect the actual memory operation.

The above techniques can substantially reduce dynamic power consumption within clock headers that drive clock signals to input registers of an embedded memory array. For example, one memory operation of an embedded memory array may be initiated in a given clock cycle. Clock signals for input registers corresponding to memory control interface signals that are not associated with the particular memory operation are shut down for this clock cycle. In this regard, clock signals for various input registers of the embedded memory array may be shut down half or more of the clock cycles for which the memory is accessed, substantially reducing power caused by switching these clock signals. Notably, the techniques for clock gating input registers of an embedded memory array described above do not require substantial changes to critical timing paths of embedded memory control signals such as the memory operation enable signals.

The foregoing description has been presented for purposes of illustration and description. Furthermore, the description is not intended to limit embodiments of the invention to the form disclosed herein. While a number of exemplary aspects and embodiments have been discussed above, those of skill in the art will recognize certain variations, modifications, permutations, additions, and sub-combinations thereof.

The various operations of methods described above may be performed by any suitable means capable of performing the corresponding functions. The means may include various hardware and/or software component(s) and/or module(s), including, but not limited to a circuit, an application specific integrated circuit (ASIC), or processor.

The various illustrative logical blocks, modules, and circuits described may be implemented or performed with a general purpose processor, a digital signal processor (DSP), an ASIC, a field programmable gate array signal (FPGA), or other programmable logic device (PLD), discrete gate, or transistor logic, discrete hardware components, or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure, may be embodied directly in hardware, in a software module executed by a processor, or in a combination of the two. A software module may reside in any form of tangible storage medium. Some examples of storage media that may be used include random access memory (RAM), read only memory (ROM), flash memory, EPROM memory, EEPROM memory, registers, a hard disk, a removable disk, a CD-ROM and so forth. A storage medium may be coupled to a processor such that the processor can read information from, and write information to, the storage medium. In the alternative, the storage medium may be integral to the processor. A software module may be a single instruction, or many instructions, and may be distributed over several different code segments, among different programs, and across multiple storage media.

The methods disclosed herein comprise one or more actions for achieving the described method. The method and/or actions may be interchanged with one another without departing from the scope of the claims. In other words, unless a specific order of actions is specified, the order and/or use of specific actions may be modified without departing from the scope of the claims.

The functions described may be implemented in hardware, software, firmware, or any combination thereof. If implemented in software, the functions may be stored as one or more instructions on a tangible computer-readable medium. A storage medium may be any available tangible medium that can be accessed by a computer. By way of example, and not limitation, such computer-readable media can comprise RAM, ROM, EEPROM, CD-ROM, or other optical disk storage, magnetic disk storage, or other magnetic storage devices, or any other tangible medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs usually reproduce data optically with lasers.

Thus, a computer program product may perform operations presented herein. For example, such a computer program product may be a computer readable tangible medium having instructions tangibly stored (and/or encoded) thereon, the instructions being executable by one or more processors to perform the operations described herein. The computer program product may include packaging material.

Software or instructions may also be transmitted over a transmission medium. For example, software may be transmitted from a website, server, or other remote source using a transmission medium such as a coaxial cable, fiber optic cable, twisted pair, digital subscriber line (DSL), or wireless technology such as infrared, radio, or microwave.

Further, modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a CD or floppy disk, etc.), such that a user terminal and/or base station can obtain the various methods upon coupling or providing the storage means to the device. Moreover, any other suitable technique for providing the methods and techniques described herein to a device can be utilized.

Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein may be utilized. Accordingly, the appended claims include within their scope such processes, machines, manufacture, compositions of matter, means, methods, or actions.

What is claimed is:

1. A processing device, comprising:
a processing component that receives a system clock signal and is operable to process instructions synchronously with the system clock signal;
a memory component coupled to the processing component through a memory control interface, the memory component receiving the system clock signal and including a sequential element physically laid out in a manner that registers a memory control signal of the memory control interface based on a gated system clock signal; and
a clock gating element that receives the system clock signal and a clock gate enable signal, the clock gating element controlled by the clock gate enable signal to generate the gated system clock signal, the clock gate enable signal coupled to the processing component,
wherein the processing component processes an instruction associated with the memory control signal, in response to the memory control signal having previously been identified to not meet a minimum setup time associated with clock-gating the memory control signal, to:
identify a clock gating location prior to an execution stage of an instruction processing sequence that is upstream of the memory control signal by an amount that satisfies the minimum setup time without modifying the physical layout of the sequential element; and
generate a clock enable value for the clock gate enable signal associated with the instruction at the clock gating location.

2. The processing device of claim 1, wherein the memory component performs a predetermined memory operation based on a memory enable signal input of the memory component, and wherein the processing component generates a memory operation value for the memory enable signal at the execution stage of the instruction processing sequence.

3. The processing device of claim 2, wherein the processing component generates an asserted clock enable value for the clock gate enable signal associated with the instruction at a pre-execution stage of the instruction processing sequence based on a determination that the instruction is associated with the predetermined memory operation prior to the processing component generating the memory operation value for the memory enable signal.

4. The processing device of claim 3, wherein processing of the instruction is terminated prior to the execution stage of the instruction processing sequence based on evaluation of a specified condition.

5. The processing device of claim 1, wherein the memory control signal comprises a read address bus and the clock gate enable signal is generated based on a determination that the instruction is associated with a memory read operation.

6. The processing device of claim 5, wherein the memory component performs the memory read operation based on a read enable signal, the read enable signal being asserted by the processing component at the execution stage.

7. The processing device of claim 1, wherein the memory control signal comprises a write address bus and the clock gate enable signal is generated based on a determination that the processing instruction is associated with a memory write operation.

8. The processing device of claim 7, wherein the memory component performs the memory write operation based on a write enable signal, the write enable signal being asserted by the processing component at the execution stage.

9. The processing device of claim 1, wherein the memory component comprises a content addressable memory and the memory control signal comprises a memory reference address bus, and wherein the clock gate enable signal is generated based on a determination that the processing instruction is associated with a content match operation.

10. The processing device of claim 9, wherein the memory component performs the content match operation based on a content addressable memory enable signal, the content addressable memory enable signal being asserted by the processing component at the execution stage.

11. A method for reducing power consumption in a processing device including a processor component and a memory component, the memory component including a sequential element physically laid out in a manner that registers one or more memory interface signals, the processing component and the memory component synchronized with a system clock, the method comprising:
processing an instruction within the processor component, the instruction associated with the one or more memory interface signals, in response to the one or more memory interface signals having previously been identified to not meet a minimum setup time associated with clock-gating the one or more memory interface signals based on an execution stage of an instruction processing sequence for the one or more memory interface signals, to:
identify a clock gating location prior to the execution stage of the instruction processing sequence that is upstream of the one or more memory interface signals by an amount that satisfies the minimum setup time without modifying the physical layout of the sequential element;
generate a clock enable value associated with one or more memory interface signals for the instruction at the clock gating location such that the clock gate enable value is generated for the instruction prior to an execution stage of an instruction processing sequence and upstream of the one or more memory interface signals;
drive the clock enable value to a clock gate enable signal associated with the one or more memory interface signals; and
receive the clock gate enable signal at a clock gate element and generating a gated system clock based on the clock gate enable signal and the system clock, the one or more memory interface signals synchronized by the gated system clock.

12. The method of claim 11, further including generating a memory operation enable value for a memory operation enable signal associated with the predetermined memory operation at the execution stage of the instruction processing sequence.

13. The method of claim 12, wherein the predetermined memory operation comprises a memory read operation and the one or more memory interface signals comprise a read address bus.

14. The method of claim 12, wherein the predetermined memory operation comprises a memory write operation and the one or more memory interface signals comprise a write address bus.

15. The method of claim 12, wherein the predetermined memory operation comprises a memory write operation and the one or more memory interface signals comprise a data input bus.

16. The method of claim 12, wherein the predetermined memory operation comprises a content addressable memory operation and the one or more memory interface signals comprise a reference address bus.

17. The method of claim 12, wherein the memory operation enable value comprises a non-asserted signal value based on a determination that processing of the instruction is to be terminated prior to the execution stage of the instruction processing sequence.

18. A computer system, comprising:
a processor for synchronously processing instructions according to an instruction processing sequence, wherein processing an instruction includes determining one or more memory interface signals associated with the instruction, the processing further including computing a memory operation enable signal during an execution stage of the instruction processing sequence;
a memory component coupled to the processor through a memory control interface, the memory component including a sequential element physically laid out in a manner that registers the one or more memory interface signals; and
a clock gating signal associated with the one or more memory interface signals of the memory control interface;
wherein the processor processes the instructions, in response to the one or more memory control interface signals having been previously identified to not meet a minimum setup time associated with clock-gating the one or more memory interface signals, to:
identify a clock gating location prior to an execution stage of an instruction processing sequence that is upstream of the one or more memory interface signals by an amount that satisfies the minimum setup time without modifying the physical layout of the sequential element; and
generating a clock gate enable value for the clock gating signal associated with the instruction at the clock gating location.

19. The method of claim 18, wherein the computing of the clock gate enable value is based on the determining of the memory access operation associated with the instruction, and wherein the determining of the memory access operation is based on determining that the instruction is included in a predetermined set of instructions associated with the memory access operation.

20. The method of claim 18, further comprising:
receiving the clock gating signal at the memory component; and
generating a gated clock signal that synchronizes input registers for the one or more memory interface signals based on the clock gating signal and a system clock.

* * * * *

UNITED STATES PATENT AND TRADEMARK OFFICE
CERTIFICATE OF CORRECTION

| | | |
|---|---|---|
| PATENT NO. | : 9,158,328 B2 | |
| APPLICATION NO. | : 13/331679 | |
| DATED | : October 13, 2015 | |
| INVENTOR(S) | : Park et al. | |

It is certified that error appears in the above-identified patent and that said Letters Patent is hereby corrected as shown below:

In the specification

Column 14, line 28, delete "tCO_RE" and insert therefor --tCO_RA--.

In the claims

Column 24, line 19, Claim 19, line 1, delete "method" and insert therefor --computer system--.

Column 24, line 26, Claim 20, line 1, delete "method" and insert therefor --computer system--.

Signed and Sealed this
Ninth Day of August, 2016

Michelle K. Lee
*Director of the United States Patent and Trademark Office*